United States Patent
Dobashi et al.

(10) Patent No.: US 8,715,836 B2
(45) Date of Patent: *May 6, 2014

(54) SURFACE-TREATED ELECTRO-DEPOSITED COPPER FOIL AND METHOD FOR MANUFACTURING THE SAME

(75) Inventors: Makoto Dobashi, Saitama (JP); Mitsuyoshi Matsuda, Saitama (JP); Sakiko Tomonaga, Saitama (JP); Hisao Sakai, Saitama (JP); Tomohiro Sakata, Saitama (JP); Junshi Yoshioka, Saitama (JP); Jo Nishikawa, Saitama (JP); Takeo Taguchi, Saitama (JP)

(73) Assignee: Mitsui Mining & Smelting Co., Ltd, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 12/282,231
(22) PCT Filed: Mar. 9, 2007
(86) PCT No.: PCT/JP2007/054681
§ 371 (c)(1),
(2), (4) Date: Sep. 9, 2008
(87) PCT Pub. No.: WO2007/105635
PCT Pub. Date: Sep. 2, 1914

(65) Prior Publication Data
US 2009/0047539 A1   Feb. 19, 2009

(30) Foreign Application Priority Data

Mar. 10, 2006 (JP) .................................. 2006-066806
Oct. 3, 2006 (JP) .................................. 2006-272326

(51) Int. Cl.
*H01L 27/108* (2006.01)
*H01L 29/76* (2006.01)
*H01L 29/94* (2006.01)

(52) U.S. Cl.
USPC ........... 428/612; 428/609; 428/671; 428/674; 428/687; 428/209; 428/450; 205/291; 205/319

(58) Field of Classification Search
USPC ......... 428/621, 209, 612, 609, 671, 674, 687, 428/450; 205/291, 319
See application file for complete search history.

(56) References Cited

U.S. PATENT DOCUMENTS 4,847,139 A * 7/1989 Wolf et al. .................... 428/209
5,437,914 A * 8/1995 Saida et al. .................... 428/209
(Continued)

FOREIGN PATENT DOCUMENTS

JP   50-2378      1/1975
JP   9-143785     6/1997
(Continued)

OTHER PUBLICATIONS

English Language Abstract of JP 2004-263296.

(Continued)

*Primary Examiner* — Cathy Lam
(74) *Attorney, Agent, or Firm* — Greenblum & Bernstein, P.L.C.

(57) ABSTRACT

It is an object to provide a surface-treated electro-deposited copper foil which has a low profile at a level equal to or excellent than that of low-profile surface-treated electro-deposited copper foils that have conventionally been supplied to the market and in which waviness affecting the straight line performance of wiring is small, and a method for manufacturing the same. In order to achieve this object, in the surface-treated electro-deposited copper foil, the maximum waviness height (Wmax) of the bonding surface to be bonded with an insulation layer-constituting material to be 0.05 μm to 0.7 μm, the maximum peak to valley height (PV) to be 0.05 to 1.5 μm, and the surface roughness (Rzjis) to be 0.1 μm to 1.0 μm. The electro-deposited copper foil used for the manufacturing of this surface-treated electro-deposited copper foil is manufactured by using a sulfuric acid base copper electrolytic solution obtained by adding 3-mercapto-1-propanesulfonic acid or bis(3-sulfopropyl)disulfide, a quaternary ammonium salt polymer having a cyclic structure, and chlorine, and using a cathode having small surface roughness, under electrolysis conditions of carrying out continuous first-step electrolysis to n-th-step electrolysis at two or more different levels of electric current density.

22 Claims, 3 Drawing Sheets

(56) References Cited

U.S. PATENT DOCUMENTS

| | | |
|---|---|---|
| 6,329,074 B1 * | 12/2001 | Fujiwara et al. ............... 428/632 |
| 6,984,456 B2 * | 1/2006 | Okada et al. ................... 428/621 |
| 7,190,016 B2 * | 3/2007 | Cahalen et al. ............... 257/310 |
| 2004/0157080 A1 | 8/2004 | Shinozaki |
| 2004/0163842 A1 | 8/2004 | Okada et al. |
| 2006/0191897 A1 | 8/2006 | Hozumi |

FOREIGN PATENT DOCUMENTS

| | | |
|---|---|---|
| JP | 2004-35918 | 2/2004 |
| JP | 2004-263289 | 9/2004 |
| JP | 2004-263296 | 9/2004 |
| JP | 2005-15861 | 1/2005 |
| JP | 3910623 | 8/2007 |
| WO | 03/096776 | 11/2003 |

OTHER PUBLICATIONS

English Language Abstract of JP 2004-263289.
English Language Abstract of JP 3910623.
English Language Abstract of JP 2005-15861.
English Language Abstract of JP 9-143785.
English Language Abstract of JP 2004-35918.
English language abstract thereof WO 03/096776.
U.S. Appl. No. 12/298,068, filed Oct. 22, 2008, and entitled "Electro-deposited copper foil, surface-treated copper foil using the electro-deposited copper foil and copper clad laminate using the surface-treated copper foil, and a method for manufacturing the electro-deposited copper foil".
U.S. Appl. No. 11/910,050, filed Sep. 28, 2007, and entitled "Electrodeposited copper foil, its manufacturing method, surface-treated electrodeposited copper foil using the electrodeposited copper foil".

* cited by examiner

SURFACE-TREATED ELECTRO-DEPOSITED COPPER FOIL AND METHOD FOR MANUFACTURING THE SAME

TECHNICAL FIELD

The present invention relates to a surface-treated electro-deposited copper foil, an electro-deposited copper foil, and a method for manufacturing the same, as well as a rigid copper clad laminate, a rigid printed wiring board, a flexible copper clad laminate, and a flexible printed wiring board using the surface-treated electro-deposited copper foil. Particularly, the present invention relates to a surface-treated electro-deposited copper foil having a bonding surface, to be bonded with an insulation layer-forming material, having small waviness that is excellent in fine pattern wiring forming performance when used for a printed wiring board and the like, and to a method for manufacturing the same.

BACKGROUND ART

An electro-deposited copper foil is widely used as the base material of a printed wiring board because metal copper is good in electric conductivity, is relatively cheap, and is easy in handling also. The so-called downsizing, such as miniaturization and weight reduction, is required for electronic and electrical equipment in which plenty of printed wiring boards are used. Conventionally, in order to perform such downsizing of electronic and electrical equipment, wiring having a pitch as fine as possible has been required for a signal circuit. Therefore, manufacturers have achieved this by using a thinner copper foil to reduce the time for over-etching in forming wiring by etching to improve the etching factor of wiring formed.

Higher function is also simultaneously required for electronic and electrical equipment miniaturized and weight-reduced. Therefore, sharing of a parts mounting area as large as possible in a limited surface area of the substrate is required with the spreading of the surface mounting method for parts mounting. To achieve the subject, high density printed wiring board performed through a good etching factor has been required. For such a purpose, a lower-profile electro-deposited copper foil than that used for the conventional printed wiring board has been required particularly for a tape automated bonding (TAB) substrate and a chip on film (COF) substrate that are the so-called interposer substrates on which an IC chip and the like are directly mounted. By the way, the grade of profile is defined as the value of the surface roughness (Rzjis) of the bonding surface of a copper foil to be bonded with an insulation layer-forming material, measured in the TD direction according to JIS B 0601-2001, in a standard for copper foils for printed wiring boards. Low profile means that the surface roughness (Rzjis) of the bonding surface is small.

To achieve such objects, Patent Document 1 discloses a surface-treated electro-deposited copper foil characterized in that roughening treatment on a bonding surface is provided on the deposit side of a foil, in which the surface roughness Rz of the deposit side of a drum foil is equal to or smaller than the surface roughness Rz of the shiny side of the drum foil. For the manufacturing of the drum foil, an electrolytic solution, to which a compound having a mercapto group, a chloride ion, and a low molecular weight glue having a molecular weight of 10000 or less and a high molecule polysaccharides are added, is used. Specifically, it is described that the compound having a mercapto group is 3-mercapto 1-propanesulfonate, that the molecular weight of the low molecular weight glue is 3000 or less, and that the high molecule polysaccharide is hydroxyethylcellulose.

Patent Document 2 discloses a method for manufacturing an electro-deposited copper foil by the electrolysis of a sulfuric acid base copper plating solution, characterized by using a sulfuric acid base copper plating solution containing a copolymer of diallyldialkylammonium salt and sulfur dioxide. It is described that the sulfuric acid base copper plating solution preferably contains polyethylene glycol, chlorine, and 3-mercapto-1-sulfonic acid. It is described that the roughness of the deposit side, which is a laminate surface (a bonding surface) to be bonded to an insulating substrate, is small, and that for an electro-deposited copper foil having a thickness of 10 μm, a low profile with a 10-point average roughness Rz of about 1.0 μm±0.5 μm is obtained.

When an electro-deposited copper foil is manufactured using these manufacturing methods, a deposit side having a low profile is surely formed, and the electro-deposited copper foil has sufficient performance as a conventional low-profile electro-deposited copper foil.

[Patent Document 1] Japanese Patent Laid-Open No. 9-143785

[Patent Document 2] Japanese Patent Laid-Open No. 2004-35918

However, the clock frequency of a personal computer, representative of electronic and electrical equipment, is increasing drastically, and the operation speed increases also. In addition, usage of PC is not limited to just data processing, which is the original role as a conventional computer, and there are many choices where the computer itself is used similar with the AV equipment. In other words, not only a music playing function, but also a DVD recording and playing function, a TV receiving and recording function, a videophone function, and the like are equipped one after another.

From the above background, image quality sufficient for watching long hours when the image of a movie and the like is displayed is required for the monitor of a personal computer also, rather than just a data monitor. Further, it is also required to supply monitors at low cost and in a large amount. A liquid crystal display is frequently used for the monitor at present, and in mounting the driver device of the liquid crystal panel, the TAB substrate and the COF substrate are generally used. Therefore, when the high definition and the like of the monitor should be performed, the formation of finer wiring is also required for the wiring board for the driver. When evaluation on 20 μm pitch wiring is carried out, even the electro-deposited copper foil manufactured by the prior art has low profile performance with excellent surface roughness, defects due to large waviness on the edge of wiring tends to occur in the formed fine pattern wiring. Also, problems may occur in use for the electromagnetic shield for a plasma display panel where the formation of the same level of wiring is required. For example, the resolution of the screen and the like do not satisfy the designed values, if the width of the wiring was not obtained as designed.

As described above, for a surface-treated electro-deposited copper foil for use of a printed wiring board and the like, not only to be just a conventional low profile surface-treated electro-deposited copper foil but also to be a surface-treated electro-deposited copper foil having good fine pattern forming performance has been strongly required.

DISCLOSURE OF THE INVENTION

As a result of diligent study, the present inventors paid attention to, other than low profile for which Rzjis is used as an indicator, the waviness of the bonding surface as an indicator for determining whether the fine pattern forming performance is good or bad. By research and development using the indicator, the present inventors thought out a surface-treated electro-deposited copper foil having a bonding surface having a low profile and a small waviness, and a method for manufacturing the same.

A surface-treated electro-deposited copper foil according to the present invention: A surface-treated electro-deposited copper foil according to the present invention is a surface-treated electro-deposited copper foil in which any one or more of rust-proofing treatment and/or silane coupling agent treatment are performed on the surface of an electro-deposited copper foil, characterized in that the maximum waviness height (Wmax) of the bonding surface in the surface-treated electro-deposited copper foil to be bonded with an insulation layer-constituting material is 0.05 µm to 0.7 µm.

It is preferable that in the surface-treated electro-deposited copper foil according to the present invention, the bonding surface is a deposit side of the electro-deposited copper foil.

It is also preferable that in the surface-treated electro-deposited copper foil according to the present invention, the maximum peak to valley height (PV) of the bonding surface is 0.05 µm to 1.5 µm.

It is also preferable that in the surface-treated electro-deposited copper foil according to the present invention, the surface roughness (Rzjis) of the bonding surface is 0.1 µm to 1.0 µm.

It is also preferable that in the surface-treated electro-deposited copper foil according to the present invention, the ratio of the maximum waviness height (Wmax) to the maximum peak to valley height (PV) [(Wmax)/(PV)] of the bonding surface is 0.8 or more.

An electro-deposited copper foil according to the present invention: An electro-deposited copper foil according to the present invention is an electro-deposited copper foil used for the manufacturing of the surface-treated electro-deposited copper foil, characterized in that the surface roughness (Rzjis) of the shiny side of the electro-deposited copper foil is 0.4 µm to 2.0 µm.

It is preferable that in the electro-deposited copper foil according to the present invention, the gloss [Gs (60°)] of the shiny side is 70 or more.

It is also preferable that in the electro-deposited copper foil according to the present invention, the surface roughness (Rzjis) of a deposit side is 0.1 µm to 1.0 µm, and the gloss [Gs (60°)] of a deposit side is 400 or more.

It is also preferable that the electro-deposited copper foil according to the present invention has a plurality of deposited copper layers having a different crystal structure.

A method for manufacturing an electro-deposited copper foil according to the present invention: A method for manufacturing an electro-deposited copper foil according to the present invention is a method for manufacturing an electro-deposited copper foil depositing on a cathode surface by an electrolysis method using a sulfuric acid base copper electrolytic solution, characterized in that continuous first-step electrolysis to n-th-step electrolysis are carried out at two or more different levels of electric current density while electrodeposition is performed.

It is preferable that in the method for manufacturing an electro-deposited copper foil according to the present invention, the electric current density of the first-step electrolysis is 50 A/dm$^2$ to 400 A/dm$^2$.

It is preferable that in the method for manufacturing an electro-deposited copper foil according to the present invention, the electric current density of the second-step electrolysis to the n-th-step electrolysis is 15 A/dm$^2$ to 90 A/dm$^2$ and is smaller than the electric current density of the first-step electrolysis.

The sulfuric acid base copper electrolytic solution used in the method for manufacturing an electro-deposited copper foil according to the present invention is characterized by comprising one or more additives selected from glue, thiourea, polyalkylene glycol, an amine compound, a compound having a mercapto group, a chlorine ion, a high molecule polysaccharide, a copolymer of diallyldialkylammonium salt and sulfur dioxide, an oxyethylene base surfactant, polyethyleneimine or its derivative, a sulfonate of an active sulfur compound, and a quaternary ammonium salt polymer having a cyclic structure.

It is more preferable that the sulfuric acid base copper electrolytic solution comprises at least one selected from 3-mercapto-1-propanesulfonic acid (hereinafter referred to as "MPS" in the present application) and bis(3-sulfopropyl) disulfide (hereinafter referred to as "SPS" in the present application); and a quaternary ammonium salt polymer having a cyclic structure.

It is also preferable that the total concentration of MPS and/or SPS in the sulfuric acid base copper electrolytic solution is 0.5 ppm to 200 ppm.

It is also preferable that the concentration of a quaternary ammonium salt polymer having a cyclic structure in the sulfuric acid base copper electrolytic solution is 1 ppm to 100 ppm.

It is also preferable that the quaternary ammonium salt polymer having a cyclic structure in the sulfuric acid base copper electrolytic solution is a diallyldimethylammonium chloride (hereinafter referred to as "DDAC" in the present application) polymer.

It is also preferable that the sulfuric acid base copper electrolytic solution comprises chlorine, and the concentration of the chlorine is 5 ppm to 100 ppm.

A copper clad laminate according to the present invention: A copper clad laminate according to the present invention is characterized in that the surface-treated electro-deposited copper foil is bonded to an insulation layer-constituting material.

It is also preferable that in the copper clad laminate, the maximum waviness height (Wmax) of the surface of the insulation layer-constituting material, after copper on the surface is fully dissolved and removed, is 0.05 µm to 0.7 µm.

It is also preferable that the copper clad laminate is a rigid copper clad laminate in which the insulation layer-constituting material contains a reinforcement.

It is also preferable that the copper clad laminate is a flexible copper clad laminate in which the insulation layer-constituting material is constituted from a flexible material having flexibility.

A printed wiring board according to the present invention: A printed wiring board according to the present invention is a rigid printed wiring board characterized by being obtained by using the rigid copper clad laminate, and a flexible printed wiring board characterized by being obtained by using the flexible copper clad laminate.

The surface-treated electro-deposited copper foil according to the present invention is an excellent low-profile surface-treated electro-deposited copper foil equal to or better than low-profile surface-treated electro-deposited copper foils that have conventionally been supplied to the market, and has a bonding surface having small waviness. Therefore, the surface-treated electro-deposited copper foil according to the present invention is suitable as material for forming the fine pitch wiring of a tape automated bonding (TAB) wiring board and/or a chip on film (COF) wiring board that has been remarkably required a low profile and small waviness for the bonding surface. The surface-treated electro-deposited copper foil according to the present invention is also suitable as a material for forming the electromagnetic wave shielding pattern in a plasma display panel.

DESCRIPTION OF SYMBOLS

Figure 1:
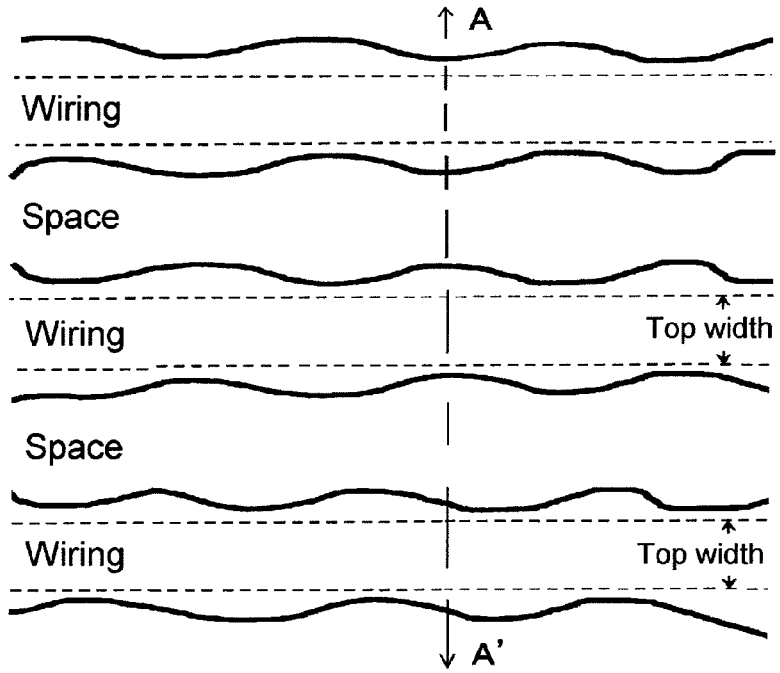
FIG. 1 is a schematic top view of the wiring on a printed wiring board that is formed by using a copper foil having a bonding surface having large waviness.

F insulation layer-constituting material
I bonding surface
$SW_T$ sidewall of the wiring formed on the portion facing to the peak of waviness
$SW_V$ sidewall of the wiring formed on the portion facing to the valley of waviness
W wiring

BEST MODE FOR CARRYING OUT THE INVENTION

An embodiment of the surface-treated electro-deposited copper foil according to the present invention: The surface-treated electro-deposited copper foil according to the present invention is a surface-treated electro-deposited copper foil in which any one or more of rust-proofing treatment and/or silane coupling agent treatment are performed on the surface of an electro-deposited copper foil, wherein the maximum waviness height (Wmax) of the bonding surface to be bonded with an insulation layer-constituting material is 0.05 μm to 0.7 μm. A more preferable range of the maximum waviness height (Wmax) of the bonding surface is 0.05 μm to 0.5 μm. In the present invention, the maximum waviness height (Wmax) is used as an indicator for detecting waviness. In the present specification, the maximum waviness height (Wmax) means the maximum value of height in wave-shape data (the sum of the maximum peak height and maximum valley depth of the wave-shape) when the wave-shape data related to waviness is extracted by using a filter from the information relating to the unevenness of a sample surface that is obtained by using a three-dimensional surface structure analysis microscope.

The present inventors used zygo New View 5032 (manufactured by ZYGO) as measurement equipment, and Metro Pro Ver. 8.0.2 as analysis software, and the low-frequency filter was set at 11 μm for measurement.

Specifically, measurement was performed by the following procedures a) to c):
a) A surface of sample piece not investigated is pasted on the sample stage.
b) Six view area with 108 μm×144 μm are selected for investigations in an area of 1 cm square of the sample piece.
c) The average of values obtained from the six view sites is used as the representative value of the sample.

With a three-dimensional surface structure analysis microscope, the actual state of the surface shape is obtained in three-dimensional numerical information as a distribution of height in the plane. Therefore, it is important to use the three-dimensional surface structure analysis microscope as an apparatus for measuring the surface shape. When only the waviness of the bonding surface are paid attention to, even lack of information is undeniable, the obtained value of the waviness by using a stylus-type roughness meter in two-dimensional numerical information indicating a distribution of height variation on the line, can be an indicator. Therefore, since RSm (JIS B 0601, 2001) obtained by using the stylus-type roughness meter can be adopted as the period of waviness, RSm can also be used as an indicator for judgment of the surface. The surface has small waviness and is smooth when RSm is large, and the surface has large waviness and is rough when RSm is small.

Suitable etching conditions in forming wiring by a subtractive method that is generally used in the manufacturing of TAB, COF and the like are performed not to remain an etching residue between wirings. To adjust preferable time, over-etching time is resulted from trials of different etching times. It is assumed that the surface-treated electro-deposited copper foil constituting the copper clad laminate has variations in surface roughness and the like of the bonding surface, so the over-etching time is required as an additional etching time not to remain an etching residues in a portion where most difficult to etch. But, the sidewall of wiring may be dissolved more than optimum in the over-etching time and the over-etching may cause a so-called undercut where the conductor is excessively dissolved in a portion under the etching resist also.

Figure 2:
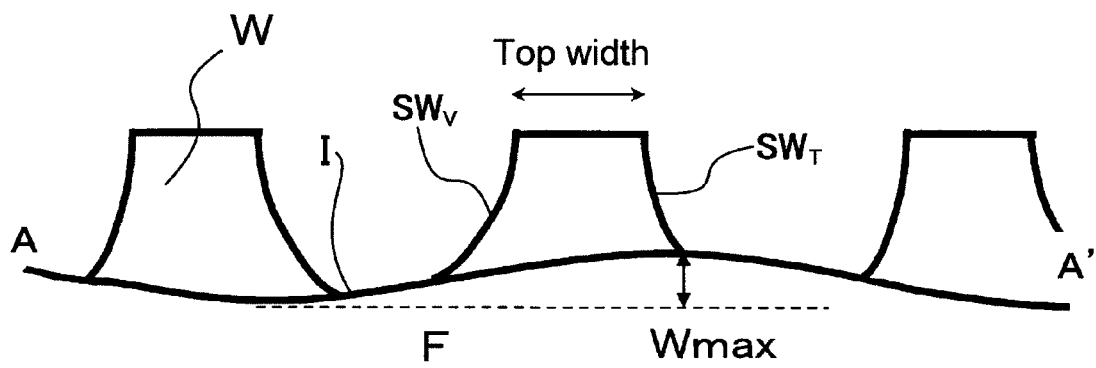
FIG. 2 is a schematic cross-sectional view of the wiring in portion A-A' shown in FIG. 1.
Figure 3:
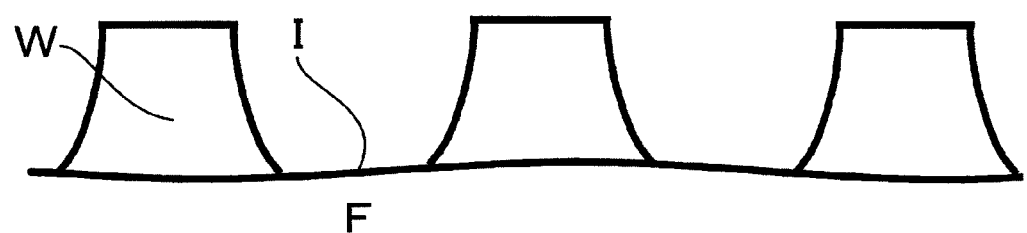
FIG. 3 is a schematic cross-sectional view of the wiring on a printed wiring board that is formed by using a copper foil having a bonding surface having small waviness.

In wiring using a surface-treated electro-deposited copper foil having a bonding surface having large waviness which is required above-described over-etching time, the width of the bottom portion of the wiring is hard to control. In the top view of the wiring above, waving is found in the bottom portion as schematically illustrated in FIG. 1. The cross section of portion A-A' in FIG. 1 is schematically illustrated in FIG. 2, with the emphasized waviness of the bonding interface between the copper foil and the insulation layer-constituting material. Schematic cross sectional view of the wiring shows a shape in which wiring W is formed on insulation layer-constituting material F and bonding surface I is exposed between the wirings. As shown in the FIG. 2, in progress of the copper etching, portion of an etched copper tends to show a circular or elliptical shape, so the etched sidewall $SW_V$ of a portion facing to the valley of waviness assumes a cross-sectional shape tailing in the bottom portion. On the other hand, the etched sidewall $SW_T$ of a portion facing to the peak of waviness is in a steep cross-sectional shape. As a result, when the wiring is observed from top, waving might be observed in the bottom edge of the wiring as shown in FIG. 1, showing poor straight line performance. On the other hand, as shown in FIG. 3, in wiring using a surface-treated electro-deposited copper foil having a bonding surface having small waviness, such problem never occurs, and the formation of wiring with excellent straight line performance can be achieved.

The rust-proofing treatment provided to the electro-deposited copper foil is carried out to prevent the surface of the surface-treated electro-deposited copper foil from being oxidized and corroded, to prevent from suffering the process of manufacturing a copper clad laminate and a printed wiring board. Further, a composition that does not inhibit adhesion with the insulation layer-constituting material and preferably improves the adhesion is recommended. For a method used in the rust-proofing treatment, any of organic rust-proofing using benzotriazole, imidazole, or the like, or inorganic rust-proofing treatment using zinc, chromate, a zinc alloy, or the like may be used, as long as it is recommended to the purpose of usage.

Next, a method for providing rust-proofing treatment will be described. For organic rust-proofing, a method such as immersion coating, showering coating and electrodeposition by using a solution of an organic rust-proofing agent can be used. For inorganic rust-proofing, a rust-proofing element can be deposited on the surface of the electro-deposited copper foil, applying an electrolysis method, an electroless plating method, a sputtering method, a substitution deposition method, and the like.

The silane coupling agent treatment provided to the electro-deposited copper foil is a treatment for improving adhesion with the insulation layer-constituting material chemically after finishing the rust-proofing treatment.

The silane coupling agent used is not particularly limited and should be selected by considering the properties of the insulation layer-constituting material and conditions of the plating solution and the like used in the manufacturing process of a printed wiring board. The silane coupling agent treatment can be carried out by a method selected from immersion coating, showering coating, and electrodeposition by using a solution of a silane coupling agent.

The bonding surface of the surface-treated electro-deposited copper foil is preferably a deposit side. In terms of just low profile, the shiny side which has a mirror shape of the surface of a rotating cathode polished may be more preferable. But, the surface condition of the rotating cathode may be unstable in the operation due to the formation of a film of a compound, such as oxide. So, to prevent to be unstable, machining, such as surface polishing, is required to be carried out. As a result, a change in surface shape occurs to makes it difficult to maintain the surface state even. But, for the deposit side that is obtained when using a copper electrolytic solution which enables level plating; a deposited copper layer grows while filling the unevenness of the surface of the rotating cathode. As a result, if there are some variations in the surface shape of the rotating cathode, a stable surface state can be obtained. Therefore, the deposit side is preferable.

The maximum peak to valley height (PV) of the bonding surface of the surface-treated electro-deposited copper foil to be bonded with the insulation layer-constituting material is preferably 0.05 μm to 1.5 μm, and more preferably 0.05 μm to 0.8 μm. The maximum peak to valley height (PV) used as one of indicators for detecting the surface shape in the present invention is the sum of the maximum peak height and maximum valley depth of the sample surface directly measured by using a three-dimensional surface structure analysis microscope. Limitation on the lowest value 0.05 μm for both PV shown here and the above-described Wmax does not mean that some defects appear when the evaluation result is less than 0.05 μm. 0.05 μm is indicated as an empirical lower limit for the surface-treated electro-deposited copper foil obtained by the manufacturing method according to the present invention.

The surface roughness (Rzjis) of the bonding surface of the surface-treated electro-deposited copper foil is preferably 0.1 μm to 1.0 μm, and more preferably 0.1 μm to 0.5 μm. RSm obtained together with the measurement of Rzjis is further preferably more than 0.1. The surface roughness (Rzjis) is a numerical value obtained by measuring in the TD direction according to JIS B 0601-2001 as described above. In the present invention, specified length for the measurement is 0.8 mm, and for the stylus, diamond stylus tip in which the R of the conical is 2 μm is used. As described above, the indicator of the degree of waving is the maximum waviness height (Wmax) of the bonding surface. But considering the actual process for manufacturing PWBs, when the surface roughness (Rzjis) of the bonding surface is more than a certain level, the over-etching time must be long. But, as described above, when the over-etching time is long, the undercut phenomenon is severe. Therefore, the surface roughness (Rzjis) of the bonding surface of the surface-treated electro-deposited copper foil is preferred to be small also. When the surface roughness is adjusted in the above range, sufficient adhesion for practical use can be ensured when the surface-treated electro-deposited copper foil is bonded to the insulation layer-constituting material. In this range, sufficient heat resistance performance, chemical resistance, and peel strength can be performed for practical use of printed wiring boards.

The ratio of the maximum waviness height (Wmax) to the maximum peak to valley height (PV) [(Wmax)/(Pv)] in the bonding surface is preferably 0.8 or more. The maximum peak to valley height (PV) is measured including roughness in a surface having waviness. Therefore, the ratio [(Wmax)/(PV)] being a value close to 1 indicates that the peak to valley height is small because peak to valley height contained in the wave-shaped surface can be considered as [(PV)−(Wmax)]. On the other hand, a small ratio indicates that peak to valley height contained in the wave-shaped surface is large. In other words, as the ratio is closer to 1, it is indicated that a portion embedded in the insulation layer-constituting material is finer, and etching conditions may require substantially no over-etching time for forming wiring.

An embodiment of the electro-deposited copper foil according to the present invention: The "electro-deposited copper foil" according to the present invention is a foil without surface treatment, and it is sometimes referred to as "untreated foil", "drum foil" and the like. In the present specification, this is simply referred to as an "electro-deposited copper foil". For the manufacturing of the electro-deposited copper foil, a continuous production process is generally applied. In the process, a sulfuric acid base copper electrolytic solution is supplied to the gap between a drum-shaped rotating cathode and a lead base anode or dimensionally stable anode (DSA) located opposed along the shape of the rotating cathode. Copper is electro-deposited on the surface of the rotating cathode, and the deposited copper is continuously peeled off as a foil from the rotating cathode and wound. The electro-deposited copper foil thus obtained is in the shape of a roll wound with a certain width. Therefore, for indicating a direction in the measurement of performance, and the like, the rotation direction of the rotating cathode (the length direction of the web) is referred to as MD (Machine Direction), and the width direction that is a direction perpendicular to MD is referred to as TD (Transverse Direction).

The surface shape of the side of the electro-deposited copper foil peeled off that is in contact with the rotating cathode is a mirror shape of the surface of the rotating cathode and is shiny; therefore, this surface is referred to as a "shiny side". On the other hand, the surface shape of the deposit side usually shows an uneven mountain-shape, because growth speed of the copper crystal in deposition differs for each crystal face, so this side is referred to as a "deposit side". Generally, the deposit side of the electro-deposited copper foil after providing surface treatment is the bonding surface to be bonded with the insulation layer-constituting material in manufacturing a copper clad laminate. Further, as described above, the copper foil with the smaller surface roughness on the bonding surface is a more excellent low-profile electro-deposited copper foil.

The surface roughness (Rzjis) of the shiny side of the electro-deposited copper foil according to the present invention is preferably 0.4 μm to 2.0 μm, and more preferably 0.4 μm to 1.8 μm. The surface roughness (Rzjis) is a numerical value obtained by measuring in the TD direction according to JIS B 0601-2001 as for the deposit side. In the present invention, the surface roughness (Rzjis) of the shiny side of the electro-deposited copper foil is specified as secondary indicator to manage the surface roughness (Rzjis) of the rotating cathode. Since the surface shape of the shiny side of the electro-deposited copper foil is a mirror shape of the rotating cathode, the surface roughness of the shiny side can be used in place. The reason why secondary indicator is used as described below is that it is hard to investigate and manage the surface roughness of the rotating cathode used in continuous production even the surface shape of the rotating cathode seriously affects on the deposit side.

It is empirically understood that as the surface roughness of the rotating cathode increases, the surface roughness of the deposit side of the obtained electro-deposited copper foil tends to increase. In other words, for manufacturing a thick electro-deposited copper foil, if a copper electrolytic solution which enables a deposit side smooth is used, the electro-deposited copper foil may get thickness while filling the unevenness of the surface of the rotating cathode without serious problem. But, in an electro-deposited copper foil having a thickness of 20 μm or less; it is not preferable to use the rotating cathode with the surface roughness (Rzjis) of more than 2.0 μm to obtain a deposition state in which the surface roughness (Rzjis) of the deposit side is 1.0 μm or less. For a surface-treated electro-deposited copper foil obtained using an electro-deposited copper foil having a thickness of 12 μm with a shiny side surface roughness (Rzjis) of more than 2.0 μm, investigation result of the maximum waviness height (Wmax) of the deposit side tends to be more than 0.7 μm. Therefore, the surface-treated electro-deposited copper foil could not be preferred one.

The gloss [Gs (60°)] of the shiny side of the electro-deposited copper foil is preferably 70 or more. In the present invention, the gloss is also an indicator to clearly show a difference in the smoothness of the deposit side of the electro-deposited copper foil. [Gs (60°)] is used for the gloss herein. In [Gs (60°)] measurement, light is illuminated on the surface of a specimen at an incidence angle of 60°, and the intensity of light reflected at a reflection angle of 60° is measured. The gloss in the present invention is measured by glossmeter VG-2000 model manufactured by Nippon Denshoku Industries Co., Ltd. according to JIS Z 8741-1997.

In the shiny side of the electro-deposited copper foil, as the surface roughness increases, a difference in unevenness shape viewed from different directions TD and MD increases. This is because the shiny side is the mirror shape of the surface shape of the rotating cathode. By the way, the shape formed on the surface of the rotating cathode has directivity. It is caused by the method for manufacturing and maintenance of the rotating cathode, i.e. a mechanical surface finishing method in which cutting and polishing are performed while cathode rotating, and the like. Therefore, not to cause TD/MD direction difference in the electro-deposited copper foil deposited on the surface of the rotating cathode, the TD/MD direction difference in the surface of the rotating cathode is required to be decreased, and it is preferable to manage the surface roughness (Rzjis) of the shiny side to be small and the gloss [Gs (60°)] to be large. Specifically, it is preferable to adjust the surface of the rotating cathode to perform the roughness (Rzjis) of the shiny side is 0.4 μm to 2.0 μm and the gloss [Gs (60°)] is 70 or more. It is more preferable that the surface roughness (Rzjis) of the shiny side is 0.4 μm to 1.8 μm and the gloss [Gs (60°)] is 100 or more. The upper limit of the gloss [Gs (60°)] of the shiny side is empirically around 500.

The surface roughness (Rzjis) of the deposit side of the electro-deposited copper foil is preferably 0.1 μm to 1.0 μm, and the gloss [Gs (60°)] of the deposit side is preferably 400 or more. The surface roughness (Rzjis) of the deposit side is more preferably 0.1 μm to 0.5 μm, and the gloss [Gs (60°)] is more preferably 600 or more. The TD/MD ratio of gloss [Gs (60°)] is further preferably 90% to 110%. In order to obtain a surface-treated electro-deposited copper foil having a good surface condition, the surface of the deposit side of the electro-deposited copper foil as a base is required to be smooth and uniform. The upper limit of the gloss [Gs (60°)] of the deposit side is empirically around 800.

Figure 4:
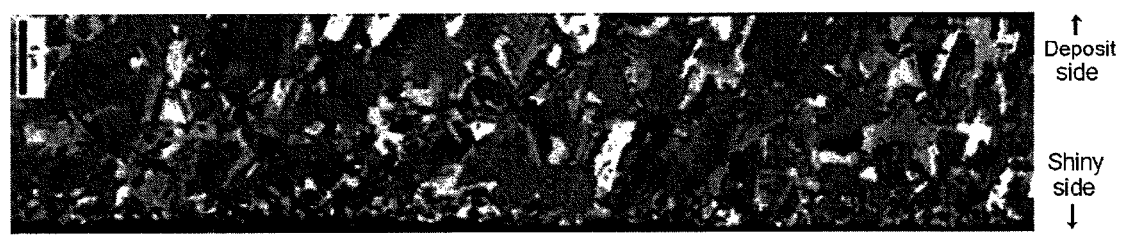
FIG. 4 is a cross-sectional view of the crystal structure of an electro-deposited copper foil obtained in Example 1.

It is also preferable that the electro-deposited copper foil has a plurality of deposited copper layers having different crystal structures. The plurality of deposited copper layers formed here is obtained by an electrolysis process comprising two or more steps in which the level of electric current density is changed, as described below. As described in FIG. 4, the plurality of deposited copper layers has a deposited copper layer having a fine crystal structure in the shiny side. It is preferable that the copper layer having the fine crystal structure exists over the entire shiny side at a constant thickness to obtain uniform and smooth deposit in the subsequent electrolysis steps.

The surface of the rotating cathode used in conventional electro-deposited copper foil manufacturing is not uniform because a film of a compound, such as oxide, is formed, and so on. As a result, the deposit site of electrodeposited copper is not well balanced. In other words, a portion where copper has been electrodeposited has priority for copper deposition to occur waviness on a deposit side of the electro-deposited copper foil. Particularly when a thin electro-deposited copper foil is to be manufactured, it is effective to cover the surface of the rotating cathode uniformly with copper as an initial deposit layer formed in a first-step electrolysis process just after starting of copper electrolysis to obtain an electro-deposited copper foil having a deposit side having a low profile and small waviness. In the present invention, it is also possible to provide third-step and subsequent-step electrolysis processes, and these processes should be carried out as required. Usually, the object of the present invention is achieved with a system having two deposited copper layers. The above-described surface treatment is provided to the electro-deposited copper foil thus obtained for the prevention of oxidation, and the like, but it is preferable that roughening treatment is not provided to achieve the object of the present invention.

An embodiment of the method for manufacturing an electro-deposited copper foil according to the present invention: The method for manufacturing an electro-deposited copper foil according to the present invention is a method for manufacturing an electro-deposited copper foil by peeling off copper deposited on the surface of a rotating cathode by an electrolysis using a sulfuric acid base copper electrolytic solution. The method is performed by carrying out continuous first-step electrolysis to n-th-step electrolysis (n≥2) with two or more different levels of electric current density. By applying the electrolysis method, an initial deposit layer in a preferable form can be formed in the first-step electrolysis, and it makes stable production of an electro-deposited copper foil with a deposit side having a low profile and small waviness possible.

The electric current density of the first-step electrolysis is preferably 50 A/dm² to 400 A/dm². When the electric current density is less than 50 A/dm², it is difficult to obtain the initial deposit layer as a uniform electrodeposited copper layer. When the electric current density is more than 400 A/dm², for example, hydrogen may be generated on the cathode to result the degradation of the properties and condition on the surface of the rotating cathode rapidly. Preferable electric current density is 71 A/dm² or more to further enhance effect. The electric current density herein is electric current density in anode (DA) adjusted according to the copper electrolytic solution used. Essentially, the deposition state should be managed with electric current density in cathode (DK) because the deposition state depends on DK, but actually, it is hard to measure DK, so DA is adopted in place as the secondary indicator for management.

It is preferable that the electric current density of the second-step and subsequent-step electrolysis is 15 A/dm² to 90 A/dm² and is less than the electric current density of the first-step electrolysis. When the electric current density is less than 15 A/dm², the industrial productivity is extremely poor. When the electric current density is more than 90 A/dm², the roughness of the deposit side of the obtained electro-deposited copper foil tends to be large and it makes the production of an electro-deposited copper foil having a low profile and small waviness deposit side difficult. More preferable electric current density of the second-step and subsequent-step electrolysis is 50 A/dm² to 70 A/dm².

The sulfuric acid base copper electrolytic solution used in the method for manufacturing an electro-deposited copper foil according to the present invention comprises one or more additives selected from glue, thiourea, polyalkylene glycol, an amine compound, a compound having a mercapto group, a chlorine ion, a high molecule polysaccharide, a copolymer of diallyldialkylammonium salt and sulfur dioxide, an oxyethylene base surfactant, polyethyleneimine or its derivative, a sulfonate of an active sulfur compound, and a quaternary ammonium salt polymer having a cyclic structure. By combination of the electrolysis process, in which continuous first-step electrolysis to n-th-step electrolysis are carried out at two or more different levels of electric current density, and a sulfuric acid base copper electrolytic solution having the composition above makes stable manufacturing of an electro-deposited copper foil having a low profile and small waviness deposit side according to the present invention possible. Here, the individual electrolysis conditions in the electrolysis process having a plurality of steps should be made suitable by carrying out a trial for each composition having selected additives.

The sulfuric acid base copper electrolytic solution more preferably comprises at least one selected from MPS and SPS; and a quaternary ammonium salt polymer having a cyclic structure. In this case, the total concentration of MPS and/or SPS in the sulfuric acid base copper electrolytic solution is preferably 0.5 ppm to 200 ppm. A more preferable concentration range is 0.5 ppm to 50 ppm, and a further preferable concentration range is 1 ppm to 20 ppm. When the total concentration of MPS and/or SPS is less than 0.5 ppm, the deposit side of the electro-deposited copper foil tends to be rough to make it difficult to obtain an electro-deposited copper foil having a low profile. On the other hand, when the total concentration of MPS and/or SPS is more than 200 ppm, the effect for leveling the deposit side of the obtained electro-deposited copper foil is not improved further. In contrast, the electrodeposition might become unstable. Therefore, it is recommended that the total concentration should be in the above range to obtain a deposit side having both a low profile and small waviness even when both MPS and SPS are used also.

The MPS or SPS in the present invention is used in a meaning including salts of them, and the described value of concentration is the converted value of the concentration as a sodium salt of MPS (hereinafter referred to as "MPS-Na" in the present application) for convenience which is easy to purchase in the market. MPS is assumed to be a SPS structure in the sulfuric acid base copper electrolytic solution according to the present invention by dimerization. Therefore, for the total concentration of MPS and/or SPS, in addition to a simple substance of MPS and salts, such as MPS-Na, one added as SPS-Na, and one modified by being added as MPS into the electrolytic solution and then polymerized to SPS and the like are also included, and the converted value of the total concentration of their Na salts is the total concentration of MPS and/or SPS. The formulation of MPS and the formulation of SPS are shown below as chemical formula 1 and chemical formula 2. From the comparison of these formulations, it is clear that SPS is a dimer of MPS.

[Chemical formula 1]

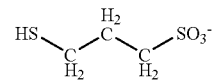

[Chemical formula 2]

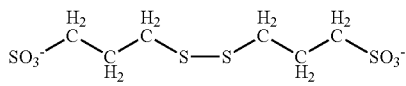

The concentration of the quaternary ammonium salt polymer having a cyclic structure in the sulfuric acid base copper electrolytic solution is preferably 1 ppm to 100 ppm, and a more preferable concentration range is 10 ppm to 50 ppm.

As the quaternary ammonium salt polymer having a cyclic structure, various compounds can be used. Considering the effect of forming a deposit side having a low profile and small waviness, the use of a DDAC polymer is most preferable. DDAC forms a cyclic structure in assuming a polymer structure, and a part of the cyclic structure is constituted from the nitrogen atom of quaternary ammonium. For the DDAC polymer, a plurality of forms, such as ones in which the cyclic structure is a five-membered ring and a six-membered ring, are present. The polymer practically used is considered as any of them or a mixture of them according to synthesis conditions. Therefore, a compound with a five-membered ring structure represents these polymers and the structure is shown below as chemical formula 3 with the counter ion of a chloride ion. The DDAC polymer is one in which DDAC takes the structure of a dimer or higher polymer as is clear in chemical formula 3. The straight chain portion constituting the polymer is more preferably composed of hydro-carbon.

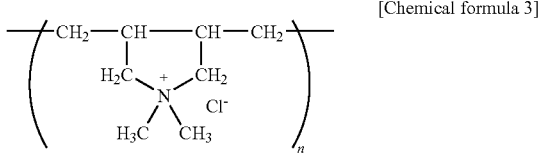

[Chemical formula 3]

The concentration of the DDAC polymer in the sulfuric acid base copper electrolytic solution is preferably 1 ppm to 100 ppm, and a more preferable concentration range is 10 ppm to 50 ppm. When the concentration of the DDAC polymer in the sulfuric acid base copper electrolytic solution is less than 1 ppm, the deposit side of the electrodeposited copper tends to be rough, no matter how high the concentration of MPS and/or SPS is, so it might be hard to obtain an electro-deposited copper foil having a low profile and small waviness deposit side. When the concentration of the DDAC polymer in the sulfuric acid base copper electrolytic solution is more than 100 ppm, the deposition state of copper might become unstable to make it difficult to obtain an electro-deposited copper foil having a low profile and small waviness deposit side.

The chlorine concentration in the sulfuric acid base copper electrolytic solution is preferably 5 ppm to 100 ppm, and a further preferable concentration range is 10 ppm to 60 ppm. When the chlorine concentration is less than 5 ppm, the deposit side of the electro-deposited copper foil tends to be rough to hardly achieve low profile. On the other hand, when the chlorine concentration exceeds 100 ppm, the electrodeposition state might become unstable to make the deposit side of the electro-deposited copper foil rough to hardly form a deposit side having a low profile.

By using the above sulfuric acid base copper electrolytic solution, the manufactured electro-deposited copper foil surely has a low profile as described above, and has excellent gloss. But, when the reduction of the waviness of the deposit side of the electro-deposited copper foil is the object, the effect performed by composition of the electrolytic solution is limited. Therefore, combination of the adjustment of the surface condition of the rotating cathode, and the use of the electrolysis method in which continuously performed first-step electrolysis to n-th-step electrolysis are carried out at two or more different levels of electric current density, as described above, is important.

An embodiment of the copper clad laminate and printed wiring board according to the present invention: The copper clad laminate according to the present invention is a copper clad laminate manufactured by bonding the surface-treated electro-deposited copper foil to an insulation layer-constituting material. The copper clad laminate in the present invention is described as a concept including all of a single-sided copper clad laminate, a double-sided copper clad laminate, and a multilayer copper clad laminate comprising inner-layer wirings inside.

When the insulation layer-constituting material contains a reinforcement, a rigid copper clad laminate is obtained. The reinforcements used in conventional rigid copper clad laminates are mostly glass clothes or glass papers. On the other hand, in recent years, in order to make BGAs and/or CSPs using a wiring board having a fine pattern at a level that does not conventionally exist, as described above. To make the surface flat, for example, aramid fibers thinner than glass fibers in a nonwoven fabric is used as a reinforcement for a copper clad laminate. It means that when the roughness of the bonding surface of the surface-treated electro-deposited copper foil is large, the fact that unevenness of the surface after etching results poor electrical performance and the like become obvious. Therefore, the rigid copper clad laminate according to the present invention is particularly suitable for use in making a printed wiring board in which the management of electrical performance is important. When the insulation layer-constituting material is a flexible material having flexibility, a flexible copper clad laminate is obtained.

In the copper clad laminate, the waviness height (Wmax) of the surface of the insulation layer-constituting material after copper on the surface is fully dissolved and removed is 0.05 μm to 0.7 μm. On the surface-treated electro-deposited copper foil described above, roughening treatment, such as the deposition of copper particles, is not provided and the waviness height (Wmax) of the bonding surface is 0.05 μm to 0.7 μm. The reason why is that the surface of the insulation layer-constituting material after copper on the surface is fully dissolved and removed, is a miller shape of the bonding surface of the surface-treated electro-deposited copper foil, and the waviness height (Wmax) shows equivalent value of 0.05 μm to 0.7 μm also.

The matching between the waviness height (Wmax) of the bonding surface of the surface-treated electro-deposited copper foil used and the waviness height (Wmax) of the surface of the insulation layer-constituting material after copper on the surface is fully dissolved and removed is most easily obtained in a flexible copper clad laminate using a plastic film, because the surface of the plastic film itself is smooth. But, in a rigid copper clad laminate which contains a reinforcement, unevenness brought by the reinforcement may sometime affect the surface shape. However, to obtain the flatter surface, for example, an aramid papers thinner than glass fibers as a reinforcement for a copper clad laminate is used as described above. Also, the effect of a reinforcement may become negligible when a resin coated copper foil is used. Therefore, good matching between the waviness height (Wmax) of the bonding surface of the surface-treated electro-deposited copper foil used and the waviness height (Wmax) of the surface of the insulation layer-constituting material can be easily obtained after copper on the surface is fully dissolved and removed.

For a method for manufacturing such copper clad laminates, conventional technology can be used. Specifically, when a rigid copper clad laminate or a flexible copper clad laminate is manufactured, a hot press method and a continuous lamination method can be used for manufacturing. In the method, the surface-treated electro-deposited copper foil according to the present invention, a rigid insulation layer-forming material such as a FR-4 prepreg or a flexible insulation layer-forming material such as a polyimide film, and a press plate are used and laid-up to form a book, and the book is sandwiched between hot plates heated to 170° C. to 200° C. for hot-press molding.

On the other hand, for the manufacturing of a flexible copper clad laminate, a roll lamination method and a casting method can be used. The roll lamination method is a method in which the wound surface-treated copper foil according to the present invention, and a wound resin film such as a polyimide film or a PET film are unwound and then the foil and the film are passed together between hot pressing rolls for thermo-compression bonding in Roll to Roll. The casting method is a method in which a resin composition, such as polyamic acid which can be a polyimide film after heating is coated on a surface of the surface-treated copper foil according to the present invention and heated to cause condensation reaction to form a polyimide film directly on the surface of the surface-treated copper foil.

The rigid printed wiring board obtained by using the rigid copper clad laminate, or the flexible printed wiring board obtained by using the flexible copper clad laminate according to the present invention is particularly a printed wiring board having stable electrical performance in that a fine pattern is formed as intended in which waving at the wiring edge is reduced and linearity of wiring is excellent, as is clear from the above description. Since the surface unevenness present in the bonding surface of the surface-treated electro-deposited copper foil according to the present invention is small and just included in the waviness of the deposit side, the surface-treated electro-deposited copper foil is also suitable for use in manufacturing a multilayer printed wiring board which may use a thin insulation layer-constituting material.

Here, one example of a conventional method for manufacturing a printed wiring board when any of the above rigid copper clad laminate or flexible copper clad laminate (hereinafter, simply referred to as a "copper clad laminate") is used will be described below. In first step, an etching resist layer is formed on a surface of a copper clad laminate, and a wiring pattern for etching is exposed and developed to form an etching resist pattern. For the etching resist layer above, a photosensitive resin, such as a dry film and a liquid resist, may be used. In addition, for exposure, UV light is generally used, and a method for forming an etching resist pattern of conventional process can be used.

Then, the electro-deposited copper foil is etched to be a wiring shape using a copper etching solution, and the required wiring shape on the surface of the rigid substrate or the flexible substrate is formed after stripping the etching resist. Also for the etching solution at this time, any of copper etching solutions, such as an acid copper etching solution and an alkaline copper etching solution, can be used.

Therefore, when a double-sided copper clad laminate and/or a multilayer copper clad laminate are used, additional process for electrical connection among the layers may be required among the process for wiring formation by etching and the like. In such a case, through holes, via holes and the like may be formed by the conventional method, followed by plating conductor to perform electrical connection between the layers. Generally, to plate the conductor, activation treatment with a palladium catalyst followed by copper electroless plating are performed, and then copper film is plated up by the electrolytic copper plating.

After finishing wiring formation by copper etching, sufficient water rinsing and drying are performed. In addition, rust-proofing treatment and the like as required are performed on a rigid printed wiring board or a flexible printed wiring board.

EXAMPLES

Preparation of Electro-Deposited Copper Foils

In these Examples, seven types of electrolytic solutions in which the concentration of various additives was adjusted to the concentration described in Table 1 were used to prepare electro-deposited copper foils. Specifically, as a sulfuric acid base copper electrolytic solution, copper sulfate (reagent) and sulfuric acid (reagent) were dissolved in pure water to adjust copper concentration of 80 g/L and free sulfuric acid concentration of 140 g/L to obtain a base solution. To the base solution, MPS-Na or SPS-Na as a sulfonate of an active sulfur compound, three types of DDAC polymers as quaternary ammonium salt polymers having a cyclic structure (UNISENCE FPA100L, FPA101L, and FPA102L manufactured by SENKA CORPORATION), and hydrochloric acid were added. The molecular weight of the DDAC polymers used satisfies FPA100L<FPA101L<FPA102L.

TABLE 1

| | Additive concentration (ppm) | | | |
|---|---|---|---|---|
| | A sulfonate of active sulfur compound | | DDAC polymer/ | |
| Example | MPS-Na | SPS-Na | (trade name) | Chlorine |
| Example 1 | 5 | — | 30/(FPA100L) | 25 |
| Example 2 | 5 | — | 5/(FPA100L) | 10 |
| Example 3 | 5 | — | 30/(FPA100L) | 25 |
| Example 4 | — | 5 | 35/(FPA100L) | 30 |
| Example 5 | — | 6 | 37/(FPA100L) | 29 |
| Example 6 | — | 30 | 71/(FPA101L) | 40 |
| Example 7 | — | 200 | 71/(FPA102L) | 40 |

In preparation of an electro-deposited copper foil, electrolysis was performed by using a rotating cathode made of a titanium plate in which the surface was polished by #2000 emery paper to adjust surface roughness (Ra) to 0.20 μm, and using DSA for an anode, with the solution temperature being 50° C., the electric current density for anode (DA) in first-step electrolysis of 74 A/dm$^2$, and the electric current density for anode (DA) in second-step electrolysis of 52 A/dm$^2$. In Example 1, an electro-deposited copper foil having a thickness of 15 μm was prepared. In Example 2, an electro-deposited copper foil having a thickness of 12 μm was prepared. In Example 3, the same solution as in Example 1 was used, and the electrolysis time was adjusted to prepare an electro-deposited copper foil having a thickness of 70 μm. In Example 4 and Example 5, substantially the same electrolytic solution as in Example 1 and Example 3, except that SPS-Na was used in place of MPS-Na, was used to prepare an electro-deposited copper foil having a thickness of 15 μm. In Example 6 and Example 7 using SPS-Na, a DDAC polymer having a large molecular weight was used, and the concentration of other additives was adjusted to be optimal to prepare an electro-deposited copper foil having a thickness of 12 μm. The evaluation results and the like of the electro-deposited copper foils prepared in Example 1 to Example 7 are shown in Table 2. For the electro-deposited copper foil of Example 1, a cross section was observed. As is clear from the observed image shown in FIG. 4, a two-layer structure was clearly found.

TABLE 2

| | | Deposit side of electro-deposited copper foil | | | | | | |
|---|---|---|---|---|---|---|---|---|
| | Copper foil | Three-dimensional surface structure analysis | | | Stylus-type roughness meter | | Gloss Gs (60°) | |
| Subject | thickness (μm) | Wmax (μm) | PV (μm) | Wmax/PV (-) | Rzjis (μm) | RSm (mm) | TD | MD |
| Example 1 | 15 | 0.37 | 0.39 | 0.949 | 0.32 | 0.19 | 659 | 665 |
| Example 2 | 12 | 0.45 | 0.48 | 0.938 | 0.31 | 0.16 | 664 | 671 |
| Example 3 | 70 | 0.065 | 0.079 | 0.823 | 0.17 | 0.39 | 691 | 686 |

TABLE 2-continued

| | Deposit side of electro-deposited copper foil | | | | | | | |
|---|---|---|---|---|---|---|---|---|
| | Copper foil | Three-dimensional surface structure analysis | | | Stylus-type roughness meter | | Gloss Gs | |
| | thickness | Wmax | PV | Wmax/PV | Rzjis | RSm | (60°) | |
| Subject | (μm) | (μm) | (μm) | (-) | (μm) | (mm) | TD | MD |
| Example 4 | 15 | 0.27 | 0.30 | 0.904 | 0.29 | 0.18 | 790 | 790 |
| Example 5 | 15 | 0.36 | 0.39 | 0.943 | 0.31 | 0.16 | 775 | 773 |
| Example 6 | 12 | 0.42 | 0.44 | 0.959 | 0.47 | 0.22 | 654 | 687 |
| Example 7 | 12 | 0.58 | 0.66 | 0.869 | 0.71 | 0.14 | 608 | 640 |
| Comparative Example | 12 | 0.82 | 1.87 | 0.439 | 1.00 | 0.07 | 324 | 383 |

Next, in Example 8 to Example 11, the same base solution as in the above-described Example 1 to Example 7 was used to prepare four types of electrolytic solutions shown in Table 3. The purpose was to evaluate the surface of the insulation layer-constituting material after copper on the surface was fully dissolved and removed. These electrolytic solutions in Table 3 were used under the same electrolysis conditions as in Example 1 to Example 7 to make four types of electro-deposited copper foils having a thickness of 15 μm.

TABLE 3

| | Additive concentration (ppm) | | | | Bonding surface of surface-treated foil | | Surface of insulation layer-constituting material after copper is dissolved and removed | |
|---|---|---|---|---|---|---|---|---|
| | DDAC polymer | MPS-Na | SPS-Na | Cl | Wmax (μm) | Rzjis (μm) | Wmax (μm) | Rzjis (μm) |
| Example 8 | 18 | 1.6 | — | 25 | 0.34 | 0.29 | 0.39 | 0.31 |
| Example 9 | 25 | 1.3 | — | 29 | 0.36 | 0.37 | 0.37 | 0.37 |
| Example 10 | 26 | — | 1.9 | 29 | 0.29 | 0.42 | 0.28 | 0.27 |
| Example 11 | 29 | — | 3.1 | 29 | 0.27 | 0.23 | 0.28 | 0.25 |

<Preparation of Surface-Treated Electro-Deposited Copper Foils>

Rust-proofing treatment was provided to both surfaces of each of the electro-deposited copper foils prepared in Example 1 to Example 11. Here, inorganic rust-proofing with conditions described below was applied. Zinc rust-proofing, using a zinc sulfate bath with a free sulfuric acid concentration of 70 g/L and a zinc concentration of 20 g/L, a solution temperature of 40° C., and an electric current density of 15 A/dm² was performed. Further, after the zinc rust-proofing was performed, chromate rust-proofing was performed by electrolysis. The electrolysis conditions at this time were a chromic acid concentration of 5.0 g/L, a pH of 11.5, a solution temperature of 35° C., an electric current density of 8 A/dm², and an electrolysis time of 5 seconds.

Immediately after water rinsing following the above rust-proofing treatments, a silane coupling agent was adsorbed on a deposit side. For the solution composition at this time, γ-glycidoxypropyltrimethoxysilane was dissolved in pure water as a solvent at a concentration of 5 g/L. The solution was splashed by showering for adsorption treatment, and the water contained was vaporized to obtain 11 types of surface-treated electro-deposited copper foils.

Figure 5:
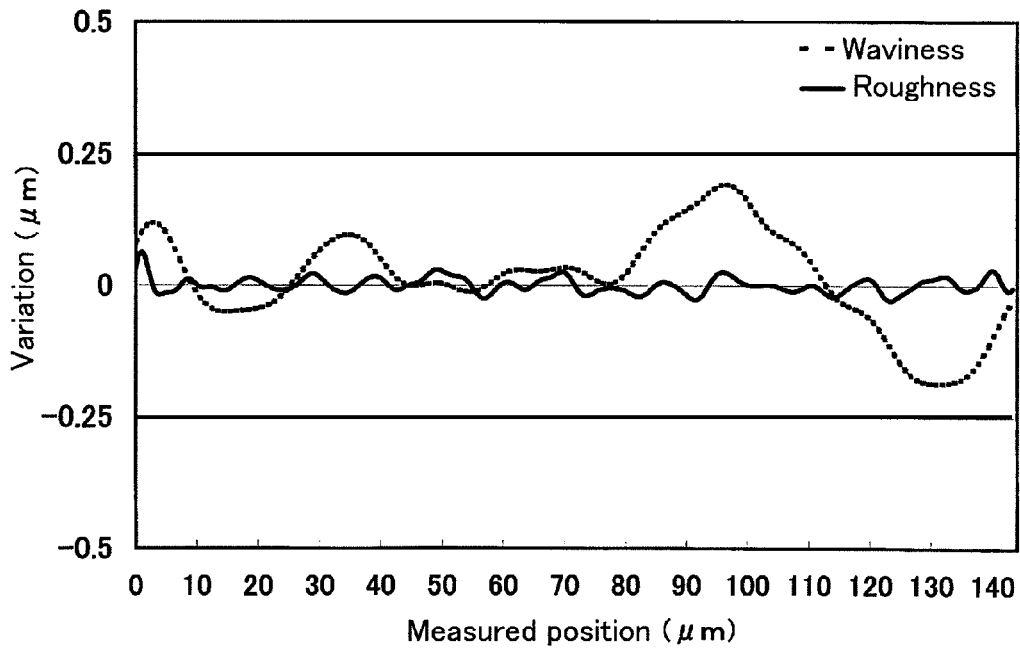
FIG. 5 is a chart showing the waviness component and the roughness component together they are separated from the data on the randomly selected straight line in the plane of the deposit side of a surface-treated electro-deposited copper foil obtained in Example 1 that is observed by a three-dimensional surface structure analysis microscope (zygo New View 5032)

Evaluation for the surface-treated electro-deposited copper foil was carried out in Example 1 to Example 7. The evaluation result is shown in Table 4. The separation of the waviness component and the roughness component in the data for the deposit side of the surface-treated electro-deposited copper foil obtained in Example 1 was performed. Specifically, data on straight line optionally selected in plane from the observation data of a three-dimensional surface structure analysis microscope (zygo New View 5032) was used for analysis. The result is shown in FIG. 5.

In Example 8 to Example 11, together with the surface-treated electro-deposited copper foil, the surface of the subsequent insulation layer-constituting material was evaluated where the copper on the surface of a copper clad laminate made by using the surface-treated electro-deposited copper foil was fully dissolved. Specifically, a polyimide resin precursor was coated on a deposit side of the surface-treated electro-deposited copper foil obtained from each Example, and heated at 350° C. to bond a polyimide film layer having a thickness of 38 μm on the surface-treated electro-deposited copper foil. For the flexible copper clad laminate thus obtained, the copper foil on the surface was fully etched by using a cupric chloride etching solution. The surface of the insulation layer-constituting material, after copper etching, was evaluated by using the three-dimensional surface structure analysis microscope (zygo New View 5032) with the same setting as that for the bonded surface-treated electro-deposited copper foil. The evaluation results and the like obtained in the Example 8 to Example 11 are shown in Table 3.

TABLE 4

| | Deposit side of surface-treated electro-deposited copper foil | | | | | | |
|---|---|---|---|---|---|---|---|
| | Three-dimensional surface structure analysis | | | Stylus-type roughness meter | | Gloss Gs (60°) | |
| Subject | Wmax (μm) | PV (μm) | Wmax/PV (-) | Rzjis (μm) | RSm (mm) | TD | MD |
| Example 1 | 0.23 | 0.27 | 0.852 | 0.28 | 0.17 | 540 | 514 |
| Example 2 | 0.50 | 0.55 | 0.909 | 0.44 | 0.16 | 507 | 479 |

TABLE 4-continued

| | Deposit side of surface-treated electro-deposited copper foil | | | | | | |
|---|---|---|---|---|---|---|---|
| | Three-dimensional surface structure analysis | | | Stylus-type roughness meter | | Gloss | |
| | Wmax | PV | Wmax/PV | Rzjis | RSm | Gs (60°) | |
| Subject | (μm) | (μm) | (-) | (μm) | (mm) | TD | MD |
| Example 3 | 0.063 | 0.07 | 0.851 | 0.15 | 0.34 | 570 | 570 |
| Example 4 | 0.32 | 0.34 | 0.930 | 0.29 | 0.21 | 581 | 584 |
| Example 5 | 0.32 | 0.34 | 0.918 | 0.30 | 0.18 | 629 | 622 |
| Example 6 | 0.28 | 0.32 | 0.869 | 0.55 | 0.16 | 595 | 627 |
| Example 7 | 0.57 | 0.64 | 0.886 | 0.70 | 0.14 | 509 | 560 |
| Comparative Example | 0.75 | 1.80 | 0.417 | 0.98 | 0.06 | 272 | 322 |

Comparative Example

Figure 6:
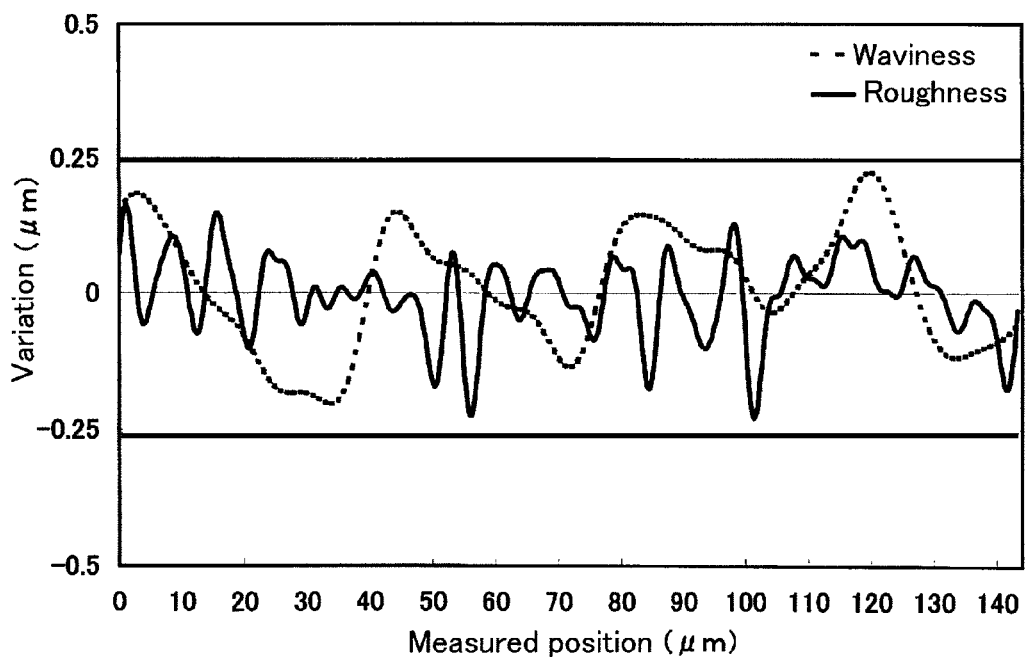
FIG. 6 is a chart showing the waviness component and the roughness component together they are separated from the data on the randomly selected straight line in the plane of the deposit side of a surface-treated electro-deposited copper foil in Comparative Example that is observed by the three-dimensional surface structure analysis microscope (zygo New View 5032).

The Comparative Example is a trace experiment of Example 4 described in Patent Document 1. A titanium plate similar to that of the Examples in this application was used for a cathode. Specifically, copper sulfate (reagent) and sulfuric acid (reagent) were dissolved in pure water to adjust a copper concentration of 90 g/L and a free sulfuric acid concentration of 110 g/L to obtain the base solution of the sulfuric acid base copper electrolytic solution described in Patent Document 1. To the solution, sodium 3-mercapto 1-propanesulfonate, hydroxyethylcellulose, and a low molecular weight glue (average molecular weight: 1000) were added at concentrations of 4 ppm, 5 ppm, and 5 ppm, respectively, and further using sodium chloride, the chlorine concentration was adjusted to 30 ppm to obtain a sulfuric acid base copper electrolytic solution. The electrolysis conditions followed Patent Document 1, and an electro-deposited copper foil having a thickness of 12 μm was obtained. The evaluation result of the obtained electro-deposited copper foil is shown in Table 2. Then, rust-proofing treatment was provided to both surfaces of the obtained electro-deposited copper foil in a manner similar to that of the Examples. The evaluation result of the obtained surface-treated electro-deposited copper foil is shown in Table 4. Further, the separation of the waviness component and the roughness component in the data on the deposit side of the obtained surface-treated electro-deposited copper foil was performed in a manner similar to that of the surface-treated electro-deposited copper foil obtained in Example 1. The result is shown in FIG. 6.

<Comparison Among Electro-Deposited Copper Foils and Surface-Treated Electro-Deposited Copper Foils>

Using the data obtained from the electro-deposited copper foils and the surface-treated electro-deposited copper foils described in Table 2, Table 3, and Table 4, the electro-deposited copper foils and the surface-treated electro-deposited copper foils according to the Examples and the Comparative Example are compared as described below.

The comparison between Example 1 and Example 3: As seen in Table 2, for the comparison of the evaluated performance of the deposit side of the electro-deposited copper foils, in the electro-deposited copper foil having a thickness of 15 μm in Example 1 and the electro-deposited copper foil having a thickness of 70 μm in Example 3, Wmax is 0.37 μm and 0.065 μm, the surface roughness (Rzjis) is 0.32 μm and 0.17 μm, and the gloss is (659/665) and (691/686) in (TD/MD). The electro-deposited copper foil in Example 3 is superior to the electro-deposited copper foil in Example 1 in any of them. In the electro-deposited copper foils according to the present invention, there is a tendency that as the thickness is increased; a deposit side having more excellent smoothness is obtained.

The comparison among Example 1 to Example 7 (except for Example 3): As seen in Table 2, in the electro-deposited copper foils obtained in Example 1 to Example 7, except for Example 3 having a thickness of 70 μm, the maximum waviness height (Wmax) of the deposit side is 0.27 μm to 0.58 μm, the maximum peak to valley height (PV) is 0.30 μm to 0.66 μm, the (Wmax/PV) ratio is 0.869 to 0.959, the surface roughness (Rzjis) is 0.29 μm to 0.71 μm, RSm is 0.14 μm to 0.22 μm, and the gloss [Gs (60°)] is (608 to 790/640 to 790) in (TD/MD). Although there is some level difference in all items, the electro-deposited copper foils have a deposit side excellent in both smoothness and small waviness. Also, no TD/MD direction difference is seen, and the foils are uniform.

The comparison between Example 1 and Example 4: Here, the comparison of MPS-Na and SPS-Na as a sulfonate of an active sulfur compound is carried out for the electro-deposited copper foils. Seeing Table 2, in the electro-deposited copper foil obtained in Example 1 and the electro-deposited copper foil obtained in Example 4, the maximum waviness height (Wmax) of the deposit side is 0.37 μm and 0.27 μm, the maximum peak to valley height (PV) is 0.39 and 0.30, the (Wmax/PV) ratio is 0.949 and 0.904, the surface roughness (Rzjis) is 0.32 μm and 0.29 μm, RSm is 0.19 μm and 0.18 μm, and the gloss [Gs (60°)] is (659/665) and (790/790) in (TD/MD). Although some superiority is seen in gloss when SPS-Na is used as in Example 4, both of the electro-deposited copper foils obtained in Example 1 and Example 4 have a deposit side excellent in both smoothness and small waviness.

Also for the surface-treated electro-deposited copper foils shown in Table 4, except for the copper foil having a thickness 70 μm obtained in Example 3, in the surface-treated electro-deposited copper foils obtained in Example 1 to Example 7, the maximum waviness height (Wmax) of the deposit side is 0.23 μm to 0.57 μm, the maximum peak to valley height (PV) is 0.27 μm to 0.64 μm, the (Wmax/PV) ratio is 0.852 to 0.930, the surface roughness (Rzjis) is 0.28 μm to 0.70 μm, RSm is 0.14 μm to 0.21 μm, and the gloss [Gs (60°)] is (507 to 629/479 to 627) in (TD/MD). Although there is some level difference in all items, the surface-treated electro-deposited copper foils have a bonding surface excellent in both smoothness and small waviness. Also, no TD/MD direction difference is seen, and the foils are uniform.

The evaluation on the surface of the insulation layer-constituting material after copper on the surface is fully dissolved and removed: Seeing Table 3, in the comparison among the surface shape of the surface-treated electro-deposited copper foils obtained in Example 8 to Example 11 and the insulation layer-constituting materials to which the surface-treated electro-deposited copper foils are bonded and then copper on the surface is fully etched, the waviness height (Wmax) is (0.27 μm to 0.36 μm/0.28 μm to 0.39 μm) in (the bonding surface of the surface-treated foils/the surface of the insulation layer-constituting materials), and the surface roughness (Rzjis) is (0.23 μm to 0.42 μm/0.25 μm to 0.37 μm) in (the bonding surface of the surface-treated foils/the surface of the insulation layer-constituting materials). They are substantially the same.

The comparison among the Examples and the Comparative Example Although the electro-deposited copper foil obtained in the Comparative Example substantially shows performance described in Patent Document 1 as shown in Table 2, the electro-deposited copper foil obtained in the Comparative Example is clearly inferior to the electro-deposited copper foils obtained in the Examples in this application. The gloss [Gs (60°)] is 324 in TD and 383 in MD, and difference between measurement directions is obvious.

Also in the surface-treated electro-deposited copper foil obtained in the Comparative Example, as shown in Table 4, the value of the maximum waviness height (Wmax) of the bonding surface that greatly affects the straight line performance of the wiring edge is larger than that of the surface-treated electro-deposited copper foils of the same thickness obtained in the Examples. Therefore, as in the electro-deposited copper foil, the surface-treated electro-deposited copper foil of the Comparative Example is clearly inferior to the surface-treated electro-deposited copper foils obtained in the Examples in this application. The gloss [Gs (60°)] is 272 in TD and 322 in MD, and difference between measurement directions is obvious. Further, as is also clear from the comparison between FIG. 5 and FIG. 6, in the deposit side of the surface-treated electro-deposited copper foils obtained in the Examples in this application, the variation of the roughness component is clearly smaller than the variation of the waviness component. On the other hand, in the surface-treated electro-deposited copper foil obtained in the Comparative Example, the variation of the waviness component itself is larger than the variation of the waviness component of the surface-treated electro-deposited copper foil obtained in the Examples in this application. Also, the variation of the roughness component is still larger, showing the same level of variation as that of the waviness component. Also from the value of RSm obtained by using the stylus-type roughness meter, it is clear that the surface-treated electro-deposited copper foils according to the present invention have narrower pitch of waviness than the surface-treated electro-deposited copper foil obtained in the Comparative Example. Also from this point, it is obvious that measurement by using the stylus-type roughness meter can give an indicator. From the comparison above, the reason why the surface-treated electro-deposited copper foils according to the present invention is suitable for use in forming fine wiring at a 20 µm pitch level is made clear. Basically, it is obvious that a good electro-deposited copper foil is required to obtain a surface-treated electro-deposited copper foil having good performance.

In the above Examples, good result is obtained by using the composition of sulfuric acid base copper electrolytic solutions having a copper concentration of about 50 g/L to 120 g/L and a free sulfuric acid concentration of about 60 g/L to 250 g/L in manufacturing of the electro-deposited copper foils according to the present invention. But, in the actual operation, the electric current density of first-step electrolysis and the electric current density of second-step and subsequent-step electrolysis, as well as the range of solution composition, the solution temperature, and the like may be changed in a suitable range according to the equipment specifications. The method or form for adding MPS, SPS, DDAC polymer, and the like described in the above Examples and/or Comparative Example is not limited. For example, when MPS is added, salt with another alkaline metal or alkaline earth metal may be used in place of MPS-Na. At this time, it is preferable to use SPS-Cu salt because the accumulation of Na can be prevented. The sulfuric acid base copper electrolytic solutions according to the present invention do not exclude the presence of other additives. Any additive may be added as long as it is confirmed that the additive further emphasizes the effect of the above additives and/or contribute quality stabilization in continuous production, and so on.

INDUSTRIAL APPLICABILITY

The surface-treated electro-deposited copper foil according to the present invention has a low profile at a level equal to or excellent than that of low-profile surface-treated electro-deposited copper foils that have conventionally been supplied to the market, and has a bonding surface having small waviness. Therefore, the surface-treated electro-deposited copper foil according to the present invention is suitable for the formation of fine pitch wiring, particularly fine wiring at a 20 µm pitch level, for a tape automated bonding (TAB) substrate and/or a chip on film (COF) substrate. Also, the surface-treated electro-deposited copper foil according to the present invention is suitable as material for forming the electromagnetic wave shield pattern in a plasma display panel and is also suitable as material for forming the bottom electrode of the embedded capacitor of a printed wiring board with embedded capacitor. Further, the surface-treated electro-deposited copper foil according to the present invention can also be suitably used as the negative electrode current collector of a lithium ion secondary battery.

The invention claimed is:

1. A surface-treated electro-deposited copper foil comprising:
    a deposit side of the electro-deposited copper foil having a surface roughness Rzjis of 0.1 µm to 1.0 µm, and a gloss [Gs(60°)] of 400 or more, wherein the deposit side of the electro-deposited copper foil is subjected to at least one surface treatment selected from a rust-proofing treatment and a silane coupling agent treatment; and
    a bonding surface formed on the deposit side of the electro-deposited copper foil after the surface treatment, wherein the bonding surface has a maximum waviness height ($W_{max}$) of 0.05 µm to 0.7 µm, and is capable of being bonded with an insulating layer-constituting material.

2. The surface-treated electro-deposited copper foil according to claim 1, wherein a surface roughness (Rzjis) of the bonding surface is 0.1 µm to 1.0 µm.

3. The surface-treated electro-deposited copper foil according to claim 1, wherein a maximum peak to valley height (PV) of the bonding surface is 0.05 µm to 1.5 µm.

4. The surface-treated electro-deposited copper foil according to claim 1, wherein a ratio of the maximum waviness height (Wmax) against to the maximum peak to valley height (PV), [(Wmax)/(PV)] of the bonding surface is 0.8 or more.

5. An electro-deposited copper foil used for manufacturing of the surface-treated electro-deposited copper foil according to claim 1, characterized in that surface roughness (Rzjis) of a shiny side of the electro-deposited copper foil is 0.4 µm to 2.0 µm.

6. The electro-deposited copper foil according to claim 5, wherein gloss [Gs (60°)] of the shiny side is 70 or more.

7. A copper clad laminate characterized by being obtained by bonding the surface-treated electro-deposited copper foil according to claim 1 to an insulation layer-constituting material.

8. The copper clad laminate according to claim 7, wherein the insulation layer-constituting material contains a reinforcement.

9. A rigid printed wiring board characterized by being obtained using the copper clad laminate according to claim 8.

10. The copper clad laminate according to claim 7, wherein the insulation layer-constituting material is constituted from a flexible material having flexibility.

11. A flexible printed wiring board characterized by being obtained using the copper clad laminate according to claim 10.

12. The surface-treated electro-deposited copper foil according to claim 1, wherein the gloss [Gs(60°)] of the deposit side is 600 or more, and the gloss [Gs(60°)] of the deposit side is higher than a gloss [Gs(60°)] of the shiny side.

13. The surface-treated electro-deposited copper foil according to claim 1, wherein the gloss [Gs(60°)] of the deposit side is a (gloss [Gs(60°)] measured along a transverse direction)/(a gloss [Gs(60°)] measured along a machine direction.

14. A method for manufacturing the electro-deposited copper foil according to claim 5 by depositing on a cathode surface by an electrolysis method using a sulfuric acid base copper electrolytic solution in which, the electrolysis method comprises a continuous first-step electrolysis to n-th-step electrolysis carried out at two or more different levels of electric current density within time required for electrolysis to manufacture the electro-deposited copper foil.

15. The method for manufacturing an electro-deposited copper foil according to claim 14, wherein an electric current density of the first-step electrolysis is 50 A/dm$^2$ to 400 A/dm$^2$.

16. The method for manufacturing an electro-deposited copper foil according to claim 14, wherein an electric current density of the second-step electrolysis to the n-th-step electrolysis is 15 A/dm$^2$ to 90 A/dm$^2$ and is smaller than the electric current density of the first-step electrolysis.

17. The method for manufacturing an electro-deposited copper foil according to claim 14, wherein the sulfuric acid base copper electrolytic solution comprises one or more additives selected from glue, thiourea, polyalkylene glycol, an amine compound, a compound having a mercapto group, a chlorine ion, a high molecule polysaccharide, a copolymer of diallyldialkylammonium salt and sulfur dioxide, an oxyethylene base surfactant, polyethyleneimine or its derivative, a sulfonate of an active sulfur compound, and a quaternary ammonium salt polymer having a cyclic structure.

18. The method for manufacturing an electro-deposited copper foil according to claim 14, wherein the sulfuric acid base copper electrolytic solution comprises at least one selected from 3-mercapto-1-propanesulfonic acid and bis(3-sulfopropyl)disulfide; and a quaternary ammonium salt polymer having a cyclic structure.

19. The method for manufacturing an electro-deposited copper foil according to claim 18, wherein a total concentration of 3-mercapto-1-propanesulfonic acid and/or bis(3-sulfopropyl)disulfide in the sulfuric acid base copper electrolytic solution is 0.5 ppm to 200 ppm.

20. The method for manufacturing an electro-deposited copper foil according to claim 17, wherein the sulfuric acid base copper electrolytic solution contains 1 ppm to 100 ppm of a quaternary ammonium salt polymer having a cyclic structure.

21. The method for manufacturing an electro-deposited copper foil according to claim 20, wherein the quaternary ammonium salt polymer having a cyclic structure in the sulfuric acid base copper electrolytic solution is a diallyldimethylammonium chloride polymer.

22. The method for manufacturing an electro-deposited copper foil according to claim 17, wherein the sulfuric acid base copper electrolytic solution comprises chlorine and wherein a concentration of the chlorine is 5 ppm to 100 ppm.

* * * * *